United States Patent [19]

Saari

[11] Patent Number: 4,656,437

[45] Date of Patent: Apr. 7, 1987

[54] CMOS OPERATIONAL AMPLIFIER WITH IMPROVED COMMON-MODE REJECTION

[75] Inventor: Veikko R. Saari, Spring Lake Heights, N.J.

[73] Assignee: AT&T Bell Laboratories, Murray Hill, N.J.

[21] Appl. No.: 814,204

[22] Filed: Dec. 27, 1985

[51] Int. Cl.[4] .............................................. H03F 3/45
[52] U.S. Cl. ................................... 330/253; 330/258; 330/311
[58] Field of Search ........................ 330/253, 258, 311

[56] References Cited

U.S. PATENT DOCUMENTS 4,533,876  8/1985  Haque et al. ........................ 330/253

OTHER PUBLICATIONS

*IBM Technical Disclosure Bulletin:* "Complementary FET Differential Amplifier" W. Cordaro, vol. 16, No. 10, Mar., 1976.
*IEEE Journal of Solid-State Circuits:* "Power-Supply Rejection in Differential Switched-Capacitor Filters" Alejandro De LaPlaza and Patrick Morlon, vol. sc-19, No. 6, Dec. 1984.

*Primary Examiner*—James B. Mullins
*Attorney, Agent, or Firm*—Volker R. Ulbrich

[57] ABSTRACT

A fully differential CMOS operational amplifier (10) of the folded cascode type includes two similar signal current branches (32,34) connected in parallel between two supply voltage nodes (V+,V−). Each branch includes an N-type bias current transistor (42,54), a P-type cascode transistor (50,62), an N-type pull-down transistor (40,52), and a P-type current source transistor (48,60), all connected respectively in series between the drain of an N-type common mode suppression feedback transistor (44,56) and the drain of a P-type common mode suppression feedback transistor (46,58). The N-type feedback transistor has its source connected to a negative supply voltage node. The P-type feedback transistor has its source connected to a positive supply voltage node. The gates of the feedback transistors of each branch are connected to the output node (36,38) at the drain of the cascode transistor. The gates of the other transistors are supplied with appropriate reference voltages ($V_{B1}$, $V_{B2}$, $V_{B3}$, $V_{B4}$). Second harmonic effects produced by the N-type and P-type feedback transistors of a branch cancel each other at the output node. Also disclosed is a connection of the current source (20,22) of the differential input stage (12) to the drains of the N-type feedback transistors for reducing noise and device mismatch effects in the input stage.

4 Claims, 1 Drawing Figure

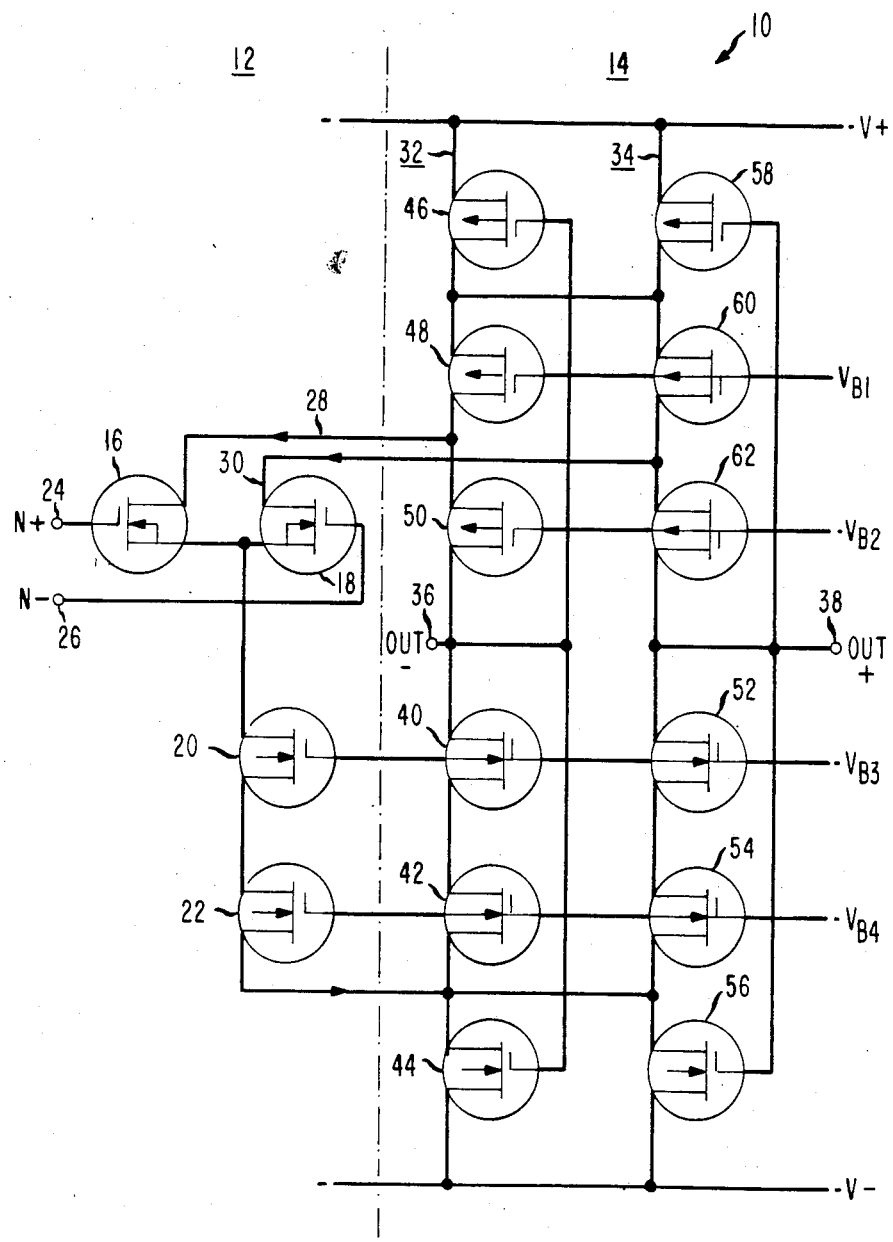

4,656,437

CMOS OPERATIONAL AMPLIFIER WITH IMPROVED COMMON-MODE REJECTION

TECHNICAL FIELD

The invention relates to electronic amplifiers, particularly fully differential monolithic operational amplifiers implemented with field-effect transistors.

BACKGROUND OF THE INVENTION

Fully differential operational amplifiers have dual inputs and outputs. They typically include a differential input stage which feeds signal currents into a transimpedance stage, which may be considered an output stage. At higher frequencies, about the audible range, such amplifiers become increasingly subject to the transmission of common mode inputs. A common mode input is a signal applied equally and in phase to both of the inputs. Such an input may arise, for example, from noise in one or both supply voltages. Amplifiers which are implemented with field-effect transistors, such as in complementary metal-oxide-semiconductor (CMOS) technology, are particularly susceptible to the effects of common mode inputs at higher frequencies because parasitic capacitances of the transistors provide coupling of extraneous noise to the signal path.

Common mode input suppression of a CMOS amplifier is typically achieved by using a differential input stage. Common mode output suppression may be achieved by the provision of a feedback control feature. In "High-Frequency CMOS Switched-Capacitor Filters for Communications Application" by T. C. Choi et al. in IEEE Journal of Solid State Circuits, vol. SC-18, No. 6, December 1983, pp. 652–664 there is described a folded cascode fully differential CMOS amplifier which includes in the transimpedance stage a pair of common-mode suppression feedback transistors. These transistors have common drains and are each in series with the bias current path of a signal branch adjacent the negative supply voltage node. They operate in the triode mode and have their gates coupled to the respective outputs of the negative and positive signal branches. By responding to the common mode component of the outputs to regulate the bias current accordingly, the feedback transistor pair significantly reduces the common mode component of the output. In doing so, however, it introduces second order harmonic components of the differential mode output signal.

SUMMARY OF THE INVENTION

In accordance with the present invention, the output common mode suppression of a fully differential CMOS operational amplifier is further improved by the provision of a second common mode suppression feedback transistor pair adjacent the other supply voltage node and also operating in the triode mode to affect the bias currents of both the output branches. The second feedback transistors generate second order harmonics of the common mode signal which are the same magnitude and inverse polarity of those generated by the first feedback transistors and thereby result in the cancellation of such harmonics at the outputs of the signal branches, even at above-audio frequencies.

BRIEF DESCRIPTION OF THE DRAWING

The drawing FIGURE shows a two stage monolithic fully-differential CMOS amplifier in accordance with a preferred embodiment of the invention.

DETAILED DESCRIPTION

The amplifier 10 shown in the drawing includes a differential input stage 12 and a transimpedance output stage 14, both connected between a positive supply voltage node V+ and a negative supply voltage node V−. All the transistors of the amplifier 10 are CMOS devices of the enhancement mode type. Reference to the connection of a transistor as such means the connection of its conduction channel, that being the source-drain path. The control electrode is referred to as a "gate." The connections of the bulk regions of the transistors to a suitable voltage would be readily apparent to one skilled in the art and are therefore not shown in order to avoid any unnecessary and distracting drawing details. Reference voltages are bias voltages which are constant relative to the signal and which may be supplied by any appropriate available source. An example of a biasing circuit for supplying such voltages for the amplifier 10 is disclosed in the above-mentioned Choi et al. publication.

The input stage 12 has a differential pair of N-type conduction channel input transistors 16, 18 with their joined sources connected to a current source formed by an N-type cascode transistor 20 and an N-type bias current capturing transistor 22 connected in series. The gates of the input transistors 16, 18 form positive and negative signal input nodes 24 and 26, respectively, while their respective drains feed signal currents to the output stage 14.

The output stage 14 has negative and positive signal branches 32, 34 which have a negative signal output node 36 and a positive signal output node 38 in their respective current paths. In the negative branch 32, a cascode pull-down transistor 40 and a bias current transistor 42, both N-type, are respectively connected between the negative output node 36 and the drain of a first common mode feedback transistor 44, which has its source connected to the negative supply voltage node V−. A cascode transistor 50 and a current source transistor 48, both P-type, are respectively connected in series, between the negative output node 36 and the drain of a second common mode feedback transistor 46 which has its source connected to the positive supply voltage node V+. In the positive branch 34 a cascode pull-down transistor 52 and a bias current transistor 54, both N-type, are respectively connected between the positive output node 38 and the drain of a first common mode feedback transistor 56, which is tied to the drain of the corresponding device 44 in the negative output branch 32. The source of the feedback transistor 56 is connected to the negative supply voltage node V−. A cascode transistor 62 and a current source transistor 60, both P-type, are respectively connected in series between the positive signal output node 38 and the drain of a second common mode feedback transistor 58 which has its source connected to the positive supply voltage node V+ and its drain tied to the drain of the corresponding device 46 of the negative signal branch 32.

The gates of the current source transistors 48 and 60 are connected to a reference voltage $V_{B1}$, lower than V+. The gates of the cascode transistors 50 and 62 are connected to a reference voltage $V_{B2}$, lower than $V_{B1}$.

The gates of the cascode transistor 20 of the input stage 12 and the pull-down transistors 40 and 52 are connected to a reference voltage $V_{B3}$, lower than $V_{B2}$. The gates of the bias current transistor 22 of the input stage 12 and the bias current transistors 42 and 54 are connected to a reference voltage $V_{B4}$, lower than $V_{B3}$. The source of the bias current transistor 22 of the input stage 12 is connected to the common drains of the first feedback transistors 44 and 56. The gates of the feedback transistors 44 and 46 of the negative branch 32 are connected to the negative output node 36, while the gates of the feedback transistors 56 and 58 of the positive branch are connected to the positive output node 38. The reference voltages $V_{B1}$ through $V_{B4}$ are set at levels which will cause the four feedback transistors 44,46,56,58 to operate in a triode mode, in which their current is linearly responsive to their gate-source voltage.

The operation of the circuit 10 in a general sense is well understood to those in the art and is discussed in the above-mentioned Choi et al. publication. The additional common-mode feedback transistors 46 and 58 in accordance with the present invention are complementary in function to their counterparts 44 and 56 of the opposite polarity type in that they also operate in a triode mode and affect the bias current in response to the common mode signal present at the output nodes 36, 38 of the amplifier 10. The addition of the opposite polarity transistors 46 and 58 has the effect of generating between the output nodes a second order harmonic of the differential output signal which is the negative of the second order harmonic component generated by the first feedback transistor pair 44,56, leading to their nulling the second harmonic component of the differential output signal and thereby significantly improving the differential performance of the amplifier 10. The added transistors further suppress the output common mode, due to their increasing the total feedback.

Another advantageous feature of the circuit 10 is the connection of the source of the bias current transistor 22 of the input stage 12 to the drains of the feedback transistors 44 and 56. This provides the input stage 12 and output stage 14 with a bias current from a common pool and reduces differential output noise that might be due to noise in the triode-mode transistors in the common-mode feedback pair 44 and 56. It also reduces a common mode output voltage error which results from mismatching of the first feedback transistors with a current limiting transistor which would otherwise be needed between the source of the current source transistor 22 and the negative supply voltage node V−.

The pull-down transistors 40,52 could also serve as bias current transistors, thereby making the bias current transistors 42,54 unnecessary. In that case the current source transistor 22 would also be eliminated, with the device 20 serving that purpose alone in the input stage 12. However, while such an arrangement is within the scope of the present invention, it has a considerably lower output impedance at the output nodes 36,38 and would for this reason be unsuitable for some purposes.

While in the above circuit 10 all the transistors are enhancement mode devices, it will be readily apparent to those skilled in the art how to implement such a circuit with the roles of the P-type and N-type transistors interchanged. Also, it can be seen that for each of the signal branches the cascode transistor, the pull-down transistor, and the bias current transistor together make up a transconductance amplifier, which could also be represented schematically as a unit with an input and an output and be substituted by some other design of transconductance amplifier. In accordance with the inventive concept, mutually identical linear current control devices which are responsive to the output of the amplifier are provided between the amplifier and both of the supply voltage nodes to lead to canceling of second order harmonics of common mode input voltages.

What is claimed is:

1. A complementary field-effect transistor circuit of the type including a differential input stage and an amplifying stage, the amplifying stage comprising:

a first signal branch having a current source connected between an amplifier and the drain of a first triode mode common mode suppression feedback transistor of a first conduction channel conductivity type which has its source connected to a first polarity supply voltage node, the gate of the first feedback transistor being connected to the output node of the amplifier, the input of the amplifier being connected to a first node of the input stage, and a second signal branch having a current source connected between an amplifier and the drain of a first triode mode common mode suppression feedback transistor of a first conduction channel conductivity type which has its source connected to the first polarity supply voltage node, the gate of the first feedback transistor being connected to the output node of the amplifier, the input of the amplifier being connected to a second output node of the input stage, and the drain of the second branch first feedback transistor being connected to the drain of the first branch first feedback transistor,

WHEREIN THE IMPROVEMENT COMPRISES:

a second triode mode common mode suppression feedback transistor of a second conduction channel conductivity type in each of the first and the second signal branches connected between a current source and a second polarity supply voltage node, the gates of the second feedback transistors being connected to the output nodes of the amplifiers of their respective signal branches, the drains of the first feedback transistors being connected together and to the source side of a current source transistor of the input stage.

2. The circuit defined in claim 1 wherein the current sources of the branches each comprise a transistor having a conduction channel of the second conductivity type with its gate connected to a first bias voltage node.

3. The circuit defined in claim 2 wherein the amplifiers each comprise a cascode transistor having a conduction channel of the second conductivity type with its drain connected to the drain of a pull-down transistor having a conduction channel of the first conductivity type, the source of the cascode transistor being the input node of the amplifier and the common node of the two transistors being the output node of the amplifier, the gates of the cascode transistors being connected to a second bias voltage node and the gates of the pull-down transistors being connected to a third bias voltage node.

4. The circuit defined in claim 3 comprising in each branch a bias current transistor having a conduction channel of the first conductivity type connected between the source of the pull-down transistor and the drains of the first feedback transistors, the gates of the bias current transistors being connected to a fourth bias voltage node.

* * * * *